United States Patent
Le et al.

(10) Patent No.: US 6,226,765 B1
(45) Date of Patent: May 1, 2001

(54) EVENT BASED TEST SYSTEM DATA MEMORY COMPRESSION

(75) Inventors: Anthony Le; James Alan Turnquist, both of Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/259,402

(22) Filed: Feb. 26, 1999

(51) Int. Cl.[7] ............................. G11C 29/00; G01R 31/28
(52) U.S. Cl. ............................ 714/718; 714/39; 714/724; 714/741; 714/742; 365/201
(58) Field of Search ................................. 714/724, 718, 714/32, 33, 39, 735, 736, 738, 741, 742; 365/189.07, 201; 324/73.1; 702/79, 85

(56) References Cited

U.S. PATENT DOCUMENTS

| | | | |
|---|---|---|---|
| 5,282,213 | * | 1/1994 | Leigh et al. ........................ 714/724 |
| 5,696,772 | * | 12/1997 | Lesmeister ........................... 714/32 |
| 5,740,086 | * | 4/1998 | Komoto ............................... 702/20 |
| 5,978,942 | * | 11/1999 | Rockoff .............................. 714/724 |
| 6,032,277 | * | 2/2000 | Okumura ............................ 714/724 |
| 6,061,283 | * | 5/2000 | Takahashi et al. ................. 365/201 |

* cited by examiner

*Primary Examiner*—Emmanuel L. Moise
(74) *Attorney, Agent, or Firm*—Muramatsu & Associates (57) ABSTRACT

An event based test system for storing event data in a compressed form to reduce the size of a memory and decompressing the data to produce the events for testing a device under test (DUT). The event based test system includes a clock count memory for storing clock count data of each event wherein the clock count data is formed of one or more data words depending on the value of the integral part data, a vernier data memory for storing vernier data of each event wherein the vernier data memory stores vernier data for two or more events in the same memory location, an address sequencer for generating address data for accessing the clock count memory and the vernier data memory, a decompressor for reproducing the clock count data from the clock count memory and the vernier data from the vernier data memory corresponding to each event. The event based test system may further include an event process controller for producing an overall delay time of each event relative to a predetermined reference point based on the clock count data and vernier data from the decompressor, and a fine delay controller for generating each event based on the overall delay time to produce test signals for testing the DUT.

8 Claims, 7 Drawing Sheets

| Event | Count Memory (27 bit width) | Vernier Memory (10 bit width) |
|---|---|---|
| T0 | T0 coarse data | T0 fine data |
| T1 | T1 coarse data | T1 fine data |
| T2 | T2 coarse data | T2 fine data |
| T3 | T3 coarse data | T3 fine data |
| T4 | T4 coarse data | T4 fine data |
| T5 | T5 coarse data | T5 fine data |
| T6 | T6 coarse data | T6 fine data |
| T7 | T7 coarse data | T7 fine data |
| T8 | T8 coarse data | T8 fine data |
| T9 | T9 coarse data | T9 fine data |
| T10 | T10 coarse data | T10 fine data |

| Event | Count Memory (27 bit width) | Vernier Memory (40 bit width) |
|---|---|---|
| T0 | T0 Count | 0, 0, 0, T0 Vernier |
| T1 | T1 Count | 0, 0, 0, T1 Vernier |
| T2, T3 | T2 Count | 0, 0, T3 Vernier, T2 Vernier |
| T4, T5, T6 | T4 Count | 0, T6 Vernier, T5 Vernier, T4 Vernier |
| T7, T8, T9, T10 | T7 Count | T10 Vernier, T9 Vernier, T8 Vernier, T7 Vernier |

| Event | Count Memory (8 bit) | Vernier Memory (40 bit width) |
|---|---|---|
| T0 | T0 Count (Word 0) | 0, 0, 0, T0 Vernier |
| T1 | T1 Count (Word 0) | 0, 0, 0, T1 Vernier |
|  | T1 Count (Word 1) | 0, 0, T3 Vernier, T2 Vernier |
| T2, T3 | T2 Count (Word 0) | 0, T6 Vernier, T5 Vernier, T4 Vernier |
|  | T2 Count (Word 1) | T10 Vernier, T9 Vernier, T8 Vernier, T7 Vernier |
|  | T2 Count (Word 2) | (Next vernier data) |
| T4, T5, T6 | T4 Count (Word 0) | (Next vernier data) |
|  | T4 Count (Word 1) | (Next vernier data) |
|  | T4 Count (Word 2) | (Next vernier data) |
|  | T4 Count (Word 3) | (Next vernier data) |
| T7, T8, T9, T10 | T7 Count (Word 0) | (Next vernier data) |

Fig. 10

| Event | Count Memory (8 bit) | Vernier Memory (40 bit width) |
|---|---|---|
| T0 | T0 Count (Word 0) | T3 Vernier, T2 Vernier, T1 Vernier, T0 Vernier |
| T1 | T1 Count (Word 0) | T7 Vernier, T6 Vernier, T5 Vernier, T4 Vernier |
|  | T1 Count (Word 1) | (Next data), T10 Vernier, T9 Vernier, T8 Vernier |
| T2, T3 | T2 Count (Word 0) | (Next vernier data) |
|  | T2 Count (Word 1) | (Next vernier data) |
|  | T2 Count (Word 2) | (Next vernier data) |
| T4, T5, T6 | T4 Count (Word 0) | (Next vernier data) |
|  | T4 Count (Word 1) | (Next vernier data) |
|  | T4 Count (Word 2) | (Next vernier data) |
|  | T4 Count (Word 3) | (Next vernier data) |
| T7, T8, T9, T10 | T7 Count (Word 0) | (Next vernier data) |

Fig. 11

EVENT BASED TEST SYSTEM DATA MEMORY COMPRESSION

FIELD OF THE INVENTION

This invention relates to an event based semiconductor test system for testing semiconductor devices, and more particularly, to a data memory compression technology for an event based semiconductor test system for storing event data therein and a data decompression technology for an event based semiconductor test system for producing events of various timings to be used to evaluate a semiconductor device under test wherein the timing of each of the events is defined by a time length from the previous event.

BACKGROUND OF THE INVENTION

In testing semiconductor IC devices by a semiconductor test system, such as an IC tester, a semiconductor IC device to be tested is provided with test signals at its appropriate pins at predetermined test timings. The IC tester receives output signals from the IC device under test generated in response to the test signals. The output signals are strobed, i.e., sampled by strobe signals with predetermined timings or delay times to be compared with expected data to determine whether the IC device functions correctly.

Traditionally, timings of the test signals and strobe signals are defined relative to a tester rate or a tester cycle of the semiconductor test system. Such a test system is sometimes called a cycle based test system. In a cycle based test system, the semiconductor device (DUT) is tested by providing a cycled pin pattern vectors at a programmed data rate (tester cycle) to a formatter with timing edges to produce desired wave forms such as test signals and strobe signals.

Generally, the various timings of the tester cycles, test signals and strobe signals are generated based on a reference clock. The reference clock (also referred to as "system clock" or "master clock") is produced by a high stable oscillator, such as a crystal oscillator provided in the IC tester. When the required timing resolution of an IC tester is equal to or an integer multiple of the highest clock rate (shortest clock cycle) of a reference clock oscillator, timing signals can be generated by simply dividing the reference clock signal by a counter or a divider and synchronizing the divided output with the reference clock.

However, modern IC testers are usually required to have timing resolution higher than the highest clock rate, i.e., the shortest time period, of a reference clock. For example, there is a case in which a reference clock used in the IC tester 10 ns (nanosecond), but the IC tester needs to have timing resolution of 0.1 ns. Furthermore, the IC testers today dynamically change such various timings in a cycle by cycle basis based on a test program.

To generate such timing signals with the timing resolution higher than the reference clock rate, it is known in the prior art that such timings are described by timing data in a test program. The timing data is a combination of an integer multiple of the reference clock time interval and a fraction of the reference clock time interval. Such timing data is stored in a timing memory and read out at each cycle of the test cycle. Thus, in each test cycle, test signals and strobe signals are generated with reference to the test cycle, such as a start point of each cycle, based on the timing data.

Figure 1:
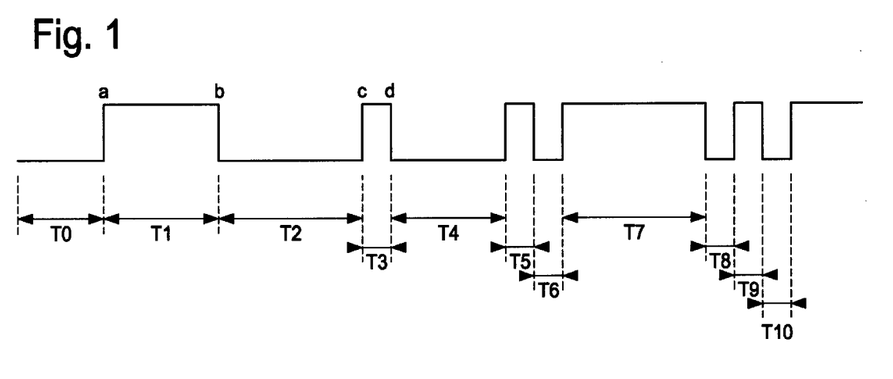
FIG. 1 is a timing chart showing timing relationships among various events used in an event based semiconductor test system for explaining the present invention.

There is another type of test system called an event based test system wherein the desired test signals and strobe signals are produced by data from an event memory directly on a per pin basis. In an event based test system, events, which are any changes in the logic state, such as rising and fallings of test signals and strobe signals, are defined with respect to time length from predetermined reference time points. Typically, such reference time points are timings of previous events such as shown in the example of FIG. 1. For producing high resolution timings, the time length between the events is defined by a combination of an integer multiple of a reference clock time interval and a fraction of the reference clock time interval.

In the example of FIG. 1, the first event (logical change) occurs at a point a which is a time T0 after a start time. For convenience of explanation, the first event is designated by T0. The second event (hereinafter event T1) occurs at a point b which is a time T1 after the point a. The third event (hereinafter event T2) occurs at a point c which is a time T2 after the point b. Likewise, events T0–T10 are shown in the example of FIG. 1.

In an event based test system, since the timing data in a timing memory (event memory) does not need to include each and every test cycle data, description of the timing data is dramatically simplified. In the event based test system, usually, the timing data for each event stored in an event memory is expressed by a time difference between the current event and the last event. Usually, such a time difference between the adjacent events is small, a size of the data in the memory can also be small, resulting in the reduction of the memory capacity.

Moreover, in the computer aided design (CAD) system widely used today for designing semiconductor devices such as an LSI and VLSI, a logic simulator in the CAD system utilizes event based test signals for evaluating the semiconductor device. Therefore, an event based test system shows a better linking ability between the design data produced by the CAD system in the design stage and the test signals to be generated using the design data.

To generate event based test signals for testing complicated and high performance semiconductor devices, a large volume of event data must be stored in an event memory. Accordingly, there is a need to establish a way of compressing the event data to store the data in the event memory and decompressing the event data from the event memory to generate the event based test signals.

SUMMARY OF THE INVENTION

Therefore, it is an object of the present invention to provide a data memory compression technology for an event based semiconductor test system for storing event data therein for producing events of various timings to be used to evaluate a semiconductor device under test.

It is an object of the present invention to provide a data memory compression technology for an event based semiconductor test system for storing event data therein for producing events of various timings to be used to evaluate a semiconductor device under test wherein the timing data of each of the events is defined by a time length from the previous event.

It is a further object of the present invention to provide a data decompression technology for reproducing event timing data based on the compressed event timing data read out from an event memory for generating event based test signals to evaluate a semiconductor device under test.

It is a further object of the present invention to provide an event based semiconductor test system wherein the timing data of each of the events is defined by a time length from the last event.

It is a further object of the present invention to provide an event based semiconductor test system for producing test signals and strobes based on event information whose time length from a previous event is defined by a combination of an integer multiple of a reference clock period and a fraction of the reference clock period.

It is a further object of the present invention to provide an event based semiconductor test system for producing test signals and strobes directly with the use of the timing data in an event memory.

It is a further object of the present invention to provide an event based semiconductor test system which is able to generate test signals and strobes with the use of the timing data stored in an event memory of small capacity.

It is a further object of the present invention to provide an event based semiconductor test system which is capable of directly using data produced by a CAD system in a design stage of the semiconductor device under test for generating test signals and strobes.

The present invention is a data memory compression technology for an event based semiconductor test system for storing event data therein for producing events of various timings to be used to evaluate a semiconductor device under test (DUT). The data compression technology includes:

a clock count memory for storing clock count data of each event which is an integer multiple of a reference clock period (integral part data) wherein the clock count data is formed of one or more data words depending on the value of the integral part data, and at least one data word includes a flag to indicate the next word is needed, a number of vernier data attached to a current event, and a part of the integral part data;

a vernier data memory for storing vernier data of each event which is a fraction of the reference clock period (fractional part data) wherein the vernier data memory stores vernier data for two or more events in the same memory location;

an address sequencer for generating address data for accessing the clock count memory and the vernier data memory to read out the clock count data and the vernier data from the respective memories; and a decompressor for reproducing the clock count data from the clock count memory and the vernier data from the vernier data memory corresponding to each event.

In a further aspect of the present invention, in addition to the structural elements above, the event based test system includes:

an event process controller for producing an overall delay time of each event relative to a predetermined reference point based on the clock count data and vernier data from the decompressor; and a fine delay controller for generating each event based on the overall delay time to produce test signals for testing the DUT.

In a further aspect of the present invention, the decompressor is comprised of: a counter for loading the clock count data from the clock count memory and down counting the clock count data by the reference clock; a clock count state machine for interpreting the clock count data and controlling the operation of the counter in loading the clock count data and counting the reference clock; a storage and selection circuit for storing the vernier data from the vernier data memory for two or more events in a parallel manner and selecting the vernier data to send the vernier data in a series manner to the event process controller; and a vernier control state machine for controlling the operation of the storage and selection circuit based on instructions received from the clock count state machine.

According to the present invention, the event based semiconductor test system is capable of storing event data in an event memory in a compressed manner to substantially reduce the size of the memory and decompressing the event data for producing the events of various timings to be used to evaluate a semiconductor device under test. In the event based test system, the event memory formed of a clock count memory to store the timing data which is integral of the reference clock and a vernier data memory to store the timing data which is a fraction of the reference clock period. The timing data of each of the events is defined by a time length from the previous event. The hardware decompressor of the present invention makes it possible to reproduce the event timing data based on the compressed event timing data read out from the event memory for generating event based test signals to evaluate a semiconductor device under test. The significant reduction in the memory size is achieved by the compression technology of the present invention.

DETAILED DESCRIPTION OF THE PREFERRED EMBODIMENT

Referring back to the timing chart of FIG. 1, each of the events T0–T10 is defined by a combination of coarse timing data and fine timing data as mentioned in the foregoing. Each of the coarse timing data shows an integer multiple of the reference clock period of the event while each of the fine timing data shows a fraction of the reference time period. Within the context of the present invention, the term "reference clock" is interchangeably used with a "master clock" and a "system clock".

Figure 2:
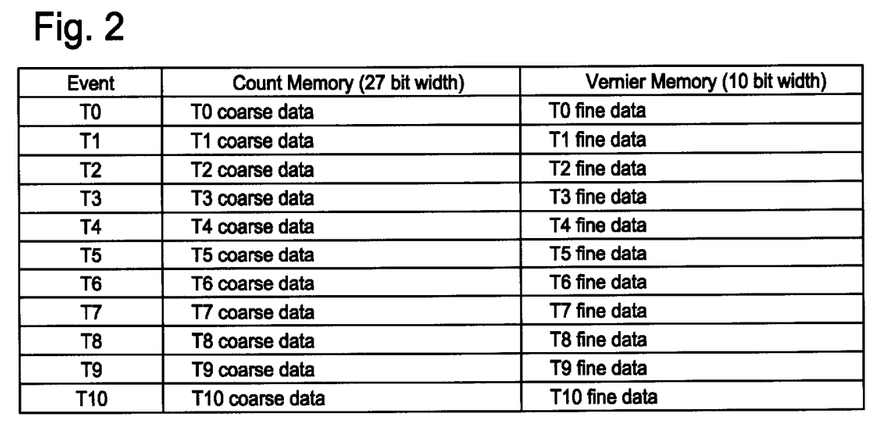
FIG. 2 is a data table showing timing data to be stored in an event memory formed of a count memory and a vernier memory for generating the events of FIG. 1.

FIG. 2 shows a data table for storing the timing data for the events T0–T10 of FIG. 1 in an event memory. The event memory is separated, for example into two, a clock count memory and a vernier data memory. The coarse timing data is stored in the clock count memory and the fine timing data is stored in the vernier data memory. Namely, for the clock count memory, the values stored can have any values from 0 to N number of reference clock periods, where N is the maximum number of reference clock period that the test system desires to support.

For example, in an event based test system under development by the assignee of this invention, the clock count memory supports up to 134,217,728 clock periods. This requires a total of 27 data bits for each event count memory location. A total size of the count memory in this case is 27-bit multiplied by M, where M is the number of vectors (test pattern length) in the test system.

As noted above, the vernier data memory stores the fine delay (timing) data designating the fraction of the reference time period. Thus, this data is less than one reference (system, mater) clock period. Depending on the fine step delay that the test system supports, the width of the vernier memory needs to be large enough to contain one full reference clock period. For example, in a test system which supports timing resolution as small as 0.5 ns when the reference clock period is 32 ns, the vernier data memory needs to have at least 6 data bits. Since the event memory also needs to store information which defines the event type, such information may be stored in the vernier memory. Here, the event type means designation of test signals such as high level, low level, or high impedance, which requires, for example, 4 data bits. Thus, in the above example, an overall memory size of the vernier data memory is 10-bit multiplied by M vectors.

Since the size of test vectors is large such as several megabyte or several ten megabyte, an overall size of the event memory becomes very large if the timing data is stored in the event memory in the manner shown in the table of FIG. 2. In this table, for each of the events T0–T10, the coarse timing (clock count) data is stored in the clock count memory having a 27-bit width and the fine timing (vernier) data is stored in the vernier data memory having a 10-bit width. As noted above, since the test vectors have a large size, the event memory of FIG. 2 requires to have a large memory capacity. For example, the number of bits used for describing the clock count data of the events T0–T10 is 297 and the number of bits used for the vernier data of events T0–T10 is 110, resulting in a total of 407 bits.

Figure 3:
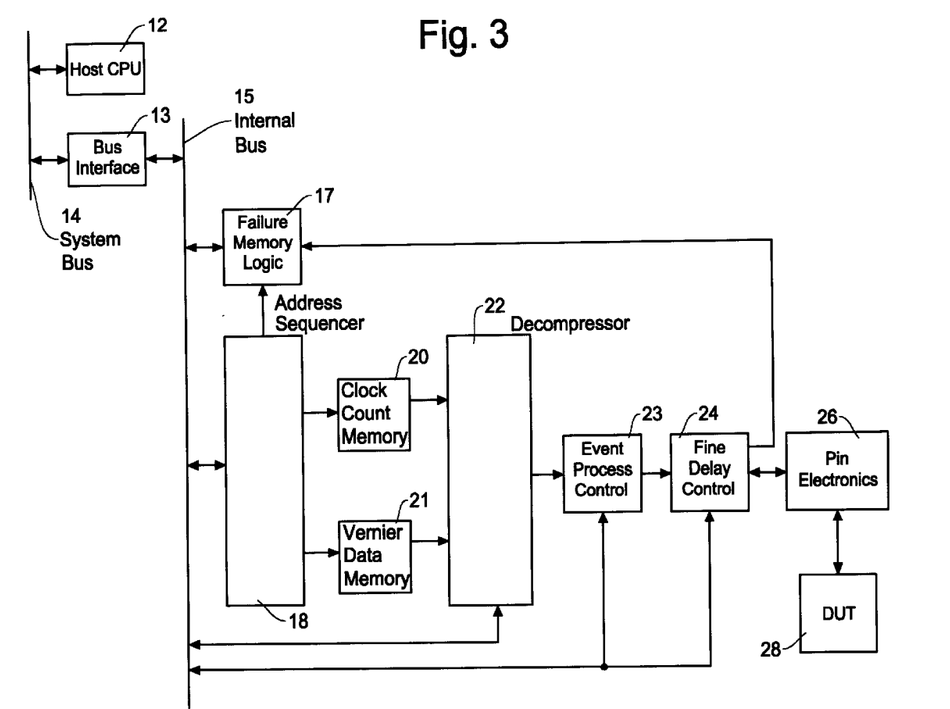
FIG. 3 is a block diagram showing a basic structure of the event based semiconductor test system incorporating the event data compression and decompression technology of the present invention.

FIG. 3 is a schematic block diagram showing an example of structure of an event based test system of the present invention using a compression and decompression technology regarding the timing data. The event based test system includes a host computer 12 and a bus interface 13 both are connected to a system bus 14, an internal bus 15, an address sequencer 18, a failure memory 17, an event memory formed of a clock count memory 20 and a vernier data memory 21, a decompressor 22, an event process controller 23, a fine delay controller 24, and a pin electronics 26. The event based test system is to evaluate a semiconductor device under test (DUT) 28, which is typically a memory IC or a microprocessor IC, connected to the pin electronics 26.

An example of the host computer 12 is a work station having a UNIX operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected with most of the functional blocks such as the address sequencer 18, failure memory 17, decompressor 22, event process controller 23, and fine delay controller 24. An example of the address sequencer 18 is a tester processor dedicated to the hardware test system and is not accessible by a user. The address sequencer 18 provides instructions to other functional blocks in the test system based on the test program and conditions from the host computer 12. The failure memory 17 stores test results, such as failure information of the DUT 28, in the addresses defined by the address sequencer 18. The information stored in the failure memory 17 is used in the failure analysis stage of the device under test.

One of the jobs of the address sequencer 18 is to provide address data to the event memory, i.e., the clock count memory 20 and the vernier data memory 21 as shown in FIG. 3. In an actual test system, a plurality of pairs of the clock count memory and the vernier data memory will be provided, each of which may correspond to a tester pin of the test system. The clock count memory 20 and vernier data memory 21 store the timing data for each event of the test signals and strobe signals. The timing data stored in the memories 20 and 21 are compressed as will be described in more detail later.

As explained with reference to the table of FIG. 2, the clock count memory 20 stores the compressed coarse timing data which is integer multiple of the reference clock, and the vernier data memory 21 stores the compressed fine timing data which is a fraction of the reference clock period. In the present invention, the timing data for each event is expressed by a time difference from the previous event as shown in the waveforms of FIG. 1.

The decompressor 22 is to reproduce the timing data out of the compressed data received from the clock count memory 20 and the vernier data memory 21. The details of the decompressor 22 is shown in the block diagram of FIG. 11 and will be described later. The event process controller is to produce an overall timing data based on the decompressed timing data from the decompressor. Basically, such overall timing data is produced by summing the integer multiple data and the fractional data. During the process of summing the timing data, a carry over operation of the fractional data (offset to the integer data) is also conducted in the event process controller 23.

The fine delay controller 24 is to actually generate the events based on the overall timing data from the event process controller 23. The delay controller 24 is composed of a plurality of delay elements selected based on the vernier value of the overall timing data. The events (test signals and strove signals) thus generated are provided to the DUT 28 through the pin electronics 26. Basically, the pin electronics 26 is formed of a large number of components, each of which is formed of a driver and a comparator as well as switches to establish input and output relationships with respect to the DUT 28.

Figure 4:
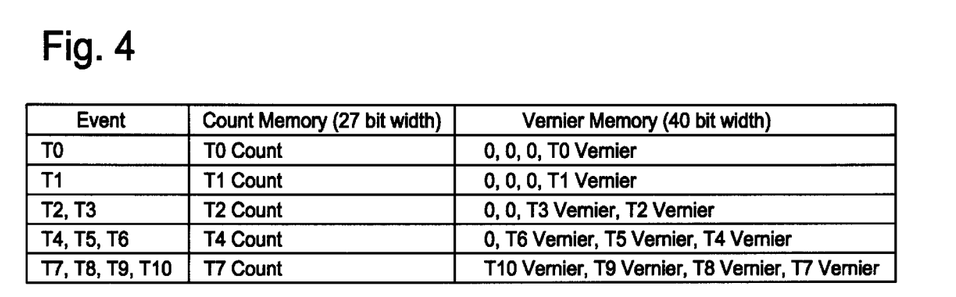
FIG. 4 is a data table showing timing data compressed in accordance with the present invention to be stored in an event memory formed of a count memory and a vernier memory for generating the events of FIG. 1.

Examples of timing data compression technology of the present invention are shown in FIGS. 4–10 corresponding to the events T0–T10 shown in FIG. 1. FIG. 4 shows the first example of timing data compression. For events that require less than one reference clock period, the coarse timing (clock count) data for these events are zero. For example, it is assumed that each of the events T3, T5, T6, T8, T9 and T10 in FIG. 1 is smaller than the reference clock period. Then it is possible to reduce the memory size of the clock count memory 20 by not assigning any memory area for these events while combining vernier data for these events in the fine timing (vernier) data in the vernier data memory 21.

In the example of FIG. 4, the vernier data memory 21 stores four (4) vernier data per clock count memory location. Thus, the vernier data memory 21 has 40-bit width. In other words, although the size of the clock count memory 20 decreases, the size of the vernier data memory 21 increases. This approach may be useful when a test vector contains many events that are less than the one reference clock period. Further, combining the vernier data of two or more events allows the test system to operate at faster frequency than the system clock frequency. This is because two or more events can be produced at the same time based on the vernier data at each access (system clock) of the event memory.

Further improvement of the timing data compression is described with reference to data structures in the clock count memory 20 shown in FIGS. 5–8. As mentioned in the example above, each clock count memory location consists of 27 data bits to accommodate the maximum possible time difference between two events. However, in many practical occasions, the time difference between the two adjacent events is substantially smaller than the maximum time difference. In such occasions, the upper data bit in the clock count memory 20 has a value "0".

For a test vector which contains many events that do not require many data bits for the clock count data as noted above, the compression techniques of FIGS. 5–8 are advantageously applied to the clock count memory. The clock count memory implements a compression scheme to conserve the memory capacity, where the high order zero bits of the clock count data are not loaded. This method requires the clock count data be divided into multiple equal data words. For example, this is achieved by dividing the 27-bit width into four fields (data words) and only storing the low order non-zero data word.

Figure 5:
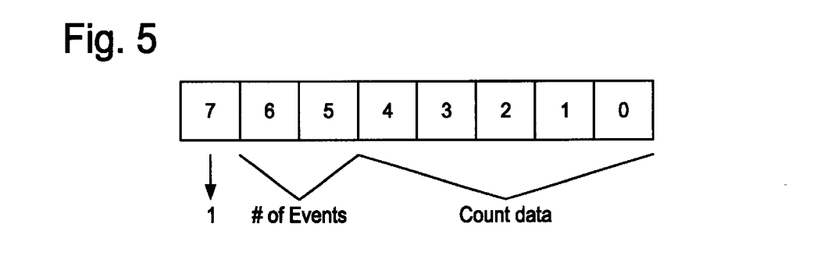
FIG. 5 is a schematic diagram showing a structure of data word to be used in a clock count memory for compressing the timing data in accordance with the present invention.

An example of data word in the clock count memory is shown in FIG. 5 which is formed of 8 bits. The data word holds the timing information of the number of integral clocks between events (clock count data) and the number of vernier data that will be triggered. As will be explained with reference to FIG. 11 later for a decompression operation, the clock count data is used to produce an event start signal while the vernier data is used to add fractional delay to the event start signal.

In the structure of FIG. 5, the clock count data is assigned to 0–4 bits, and the number of vernier data is assigned to 5–6 bits. Each data word contains a flag bit to indicate whether the next data word is needed to generate the event. In the example of FIG. 5, the last bit (#7), i.e., the most significant bit (MSB) is the flag to indicate whether the next data word is needed. If it shows "1", the timing data is complete and the next data word is unnecessary. Since five bits are assigned, clock count values of 1–31 can be expressed by the data word of FIG. 5.

Figure 6A:
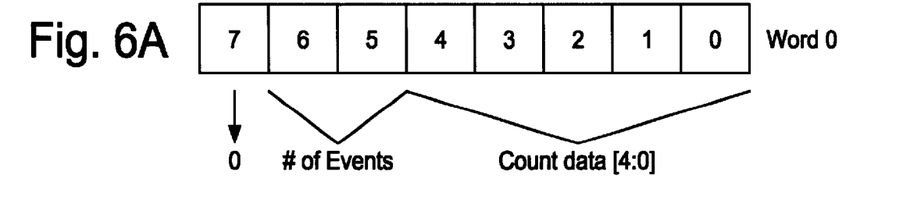
FIGS. 6A and 6B are schematic diagrams showing structures of two data words to be used in a clock count memory for compressing the timing data in accordance with the present invention.
Figure 6B:
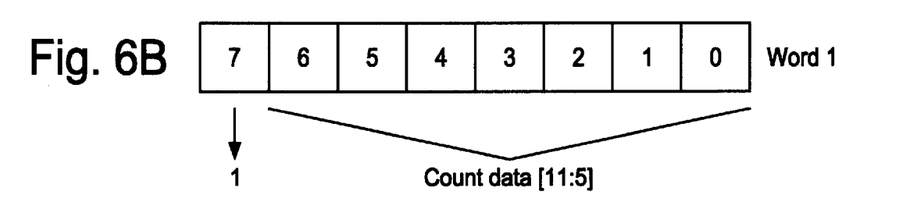

An example of two word structure is shown in FIGS. 6A and 6B which are schematic diagrams showing the structure of the first word "word 0" and the second word "word 1" in accordance with the present invention. The first word "word 0" in FIG. 6A is almost the same as that of FIG. 5 except for the flag bit #7 showing "0" to indicate that the next word is needed to describe the clock count data. The second word "word 1" of FIG. 6B has seven (7) bits to express the clock count data. The flag bit #7 of the second word shows "1" indicating that the clock count data is complete. Thus, the example of FIGS. 6A and 6B has a total of twelve (12) bits for the count data, thereby being able to express clock count values from 1 to 4,095.

Figure 7A:
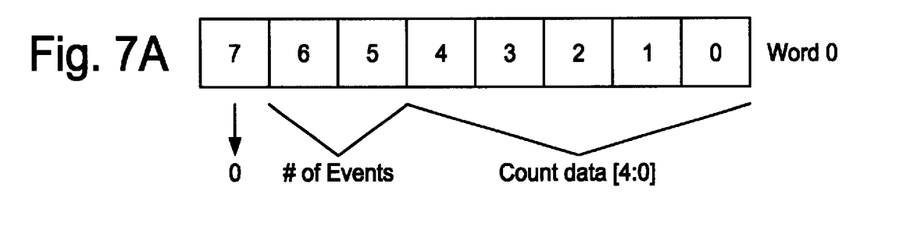
FIGS. 7A, 7B and 7C are schematic diagrams showing structures of three data words to be used in a clock count memory for compressing the timing data in accordance with the present invention.
Figure 7B:
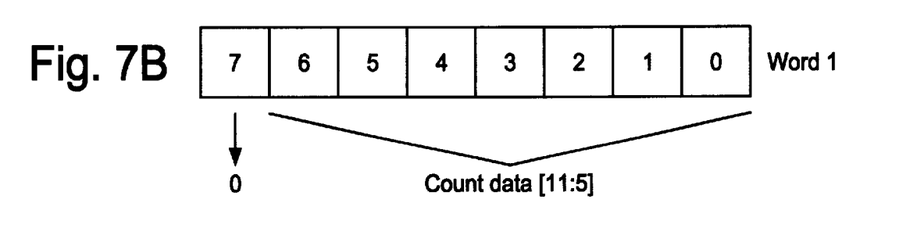
Figure 7C:
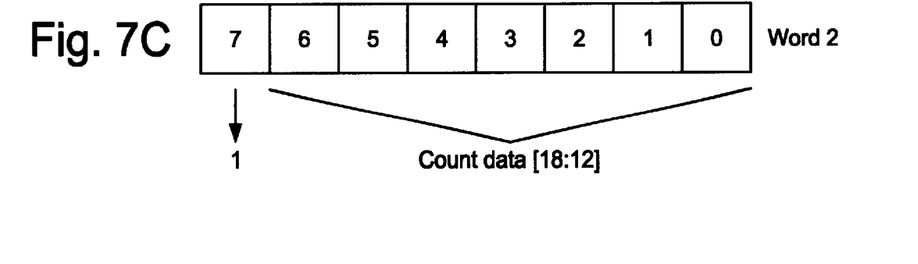

An example of three word structure is shown in the schematic diagrams of FIGS. 7A–7C in accordance with the present invention. FIG. 7A shows a structure of the first word "word 0", FIG. 7B shows a structure of the second word "word 1", and FIG. 7C shows a structure of the third word "word 2". The first word "word 0" in FIG. 7A is the same as that of FIG. 6A. The flag bit #7 shows "0" to indicate that the next word is needed to describe the clock count data. The second word "word 1" of FIG. 7B has seven (7) bits to express the count data. The flag bit #7 of the second word also shows "0" to indicate that the next word is needed to describe the clock count data.

The third word "word 2" of FIG. 7C has also seven (7) bits to express the count data. The flag bit #7 of the third word shows "1" indicating that the count data is complete. Thus, the example of FIGS. 7A–7C has a total of nineteen (19) bits for the clock count data, thereby being able to express clock count values from 1 to 524,287.

Figure 8A:
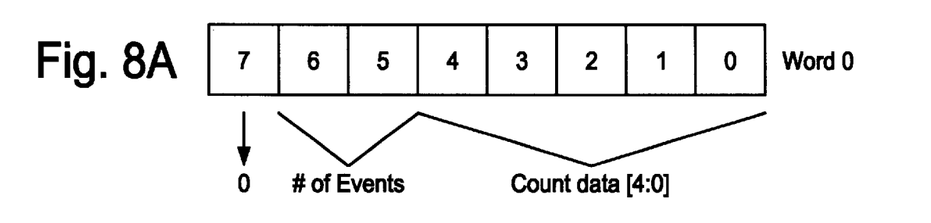
FIGS. 8A–8D are schematic diagrams showing structures of four data words to be used in a clock count memory for compressing the timing data in accordance with the present invention.
Figure 8B:
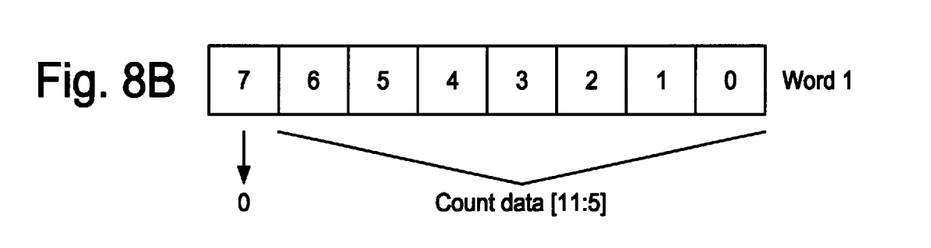
Figure 8C:
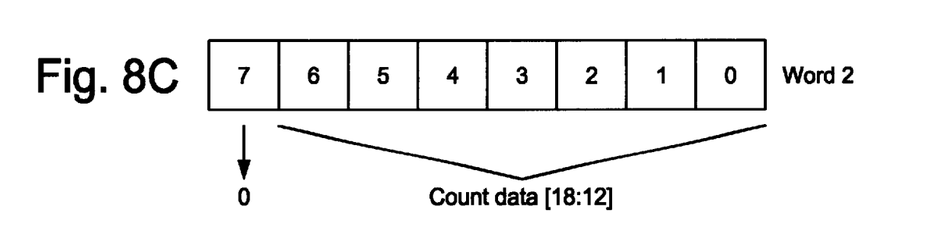
Figure 8D:
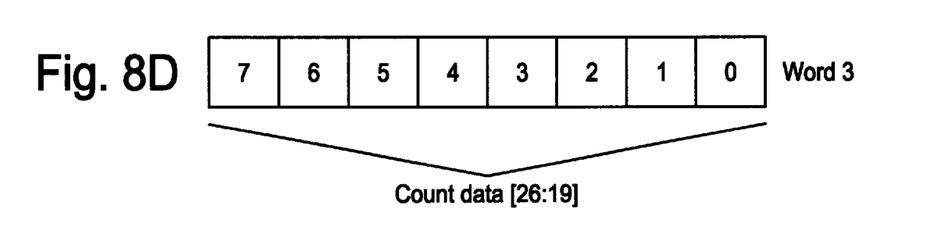

An example of four word structure is shown in the schematic diagrams of FIGS. 8A–8D in accordance with the present invention. FIG. 8A shows a structure of the first word "word 0", and FIG. 8B shows a structure of the second word "word 1". Similarly, FIG. 8C shows a structure of the third word "word 2", and FIG. 8D shows a structure of the fourth word "word 3".

The first word "word 0" in FIG. 8A is the same as that of FIGS. 6A and 7A. The flag bit #7 shows "0" to indicate that the next word is needed to describe the clock count data. The second word "word 1" of FIG. 8B has seven (7) bits to express the count data. The flag bit #7 of the second word also shows "0" to indicate that the next word is needed to describe the clock count data.

The third word "word 2" of FIG. 8C has also seven (7) bits to express the count data. The flag bit #7 of the third word shows "0" indicating that the next data is needed. The fourth word "word 3" of FIG. 8D has eight (8) bits to express the clock count data. Since the fourth word is the last word, the flag bit shown in the other words is unnecessary. Thus, the example of FIGS. 8A–8D has a total of twenty seven (27) bits for describing the clock count data, thereby being able to express clock count values from 1 to 134,217,728.

Figure 9:
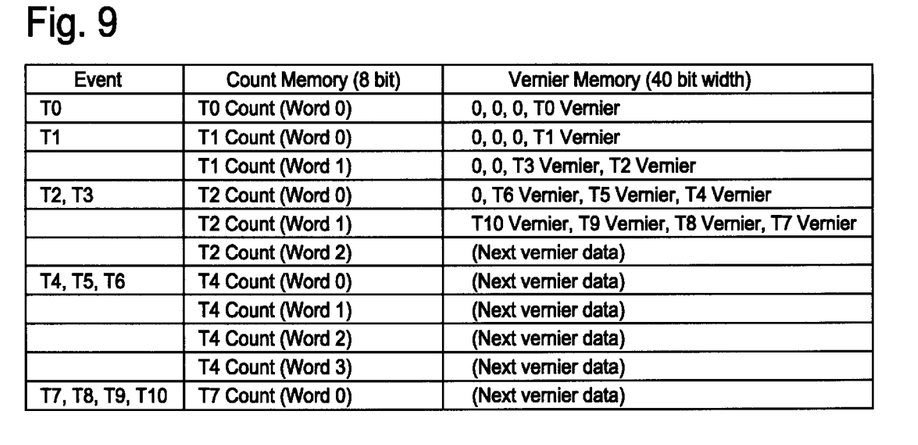
FIG. 9 is a data table showing timing data compressed in accordance with present invention in the data structure of FIGS. 5–8 to be stored in a clock count memory and a vernier data memory, respectively, for generating the events of FIG. 1.
Figure 10:
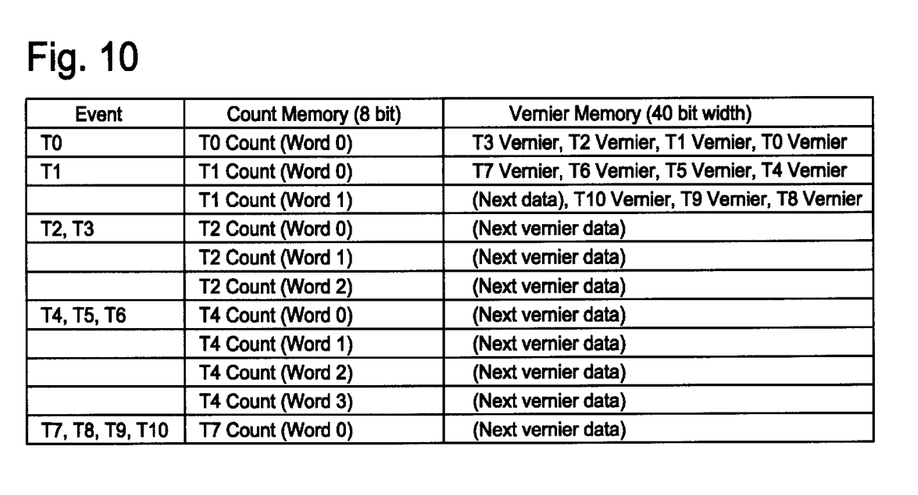
FIG. 10 is a data table showing timing data compressed in accordance with another aspect of the present invention in the data structure of FIGS. 5–8 to be stored in a clock count memory and a vernier data memory, respectively, for generating the events of FIG. 1.

FIGS. 9 and 10 are data tables showing the timing data in the clock count memory and vernier data memory compressed in accordance with present invention based on the data structures of FIGS. 5–8. The data in the table of FIGS. 9 and 10 are prepared to generate the events T0–T10 of FIG. 1. In the examples of FIG. 9 and 10, it is assumed that the clock count data of the event T0 is one word, event T1 is two words, event T2 is three words, event T4 is four words, and event T7 is one word, respectively. In FIG. 9, the number of bits used for the clock count data of events T0–T10 is 88 and the number of bits used for the vernier data is 200, resulting in a total of 288 bits. As noted above, in the example of FIG. 2, the number of total bits required is 407. Thus, significant reduction of memory size is achieved in the present invention.

The example of FIG. 10 shows further reduction in the memory size for storing the event timing data. In the case where the address sequencer of FIG. 3 can separately control the clock count memory 20 and the vernier data memory 21, it is possible to fill up the empty data bits in the vernier data memory 21 in the manner shown in FIG. 10. Since the first word of each event count data contains the number of events to be generated, it is possible to identify the correct vernier data for the current event. In FIG. 10, the number of bits used for the clock count data of events T0–T10 is 88 and the number of bits used for the vernier data is 110, resulting in a total of 198 bits, achieving further reduction in the memory size.

Figure 11:
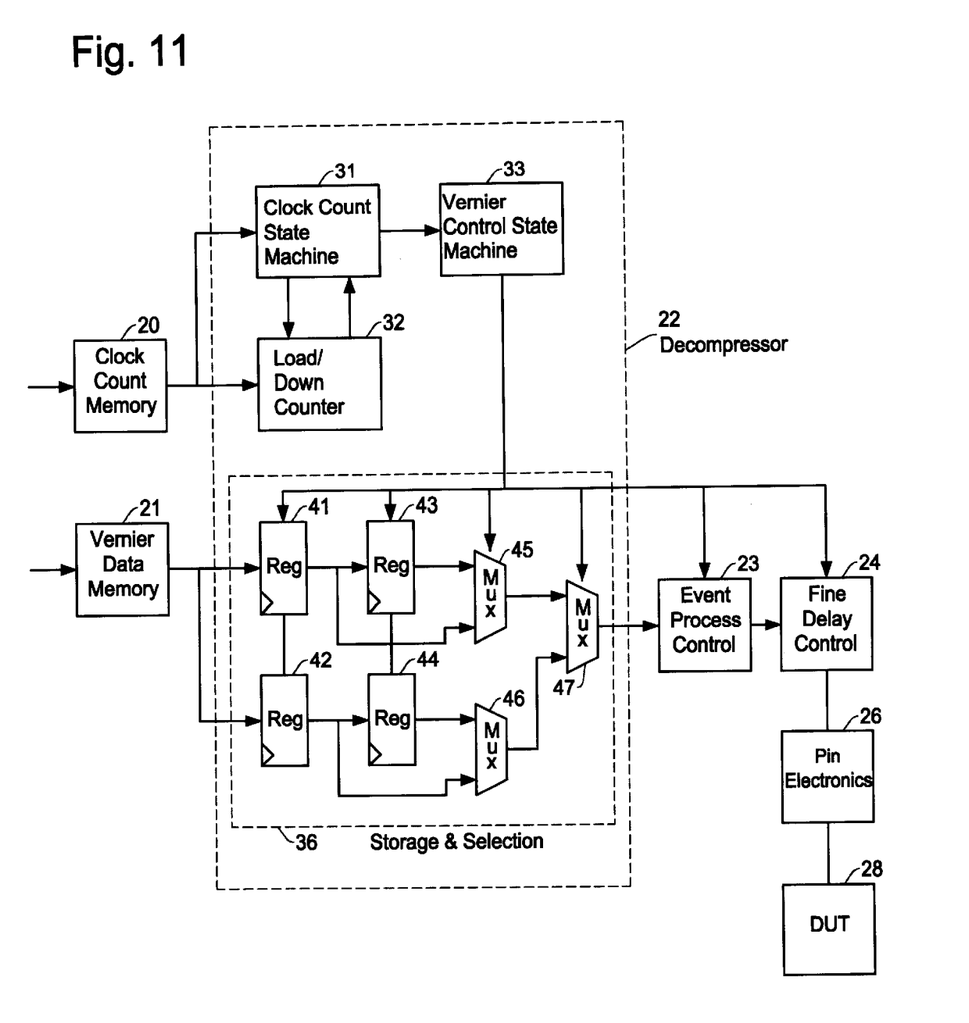
FIG. 11 is a block diagram showing an example of a hardware decompression circuit for decompressing the timing data received from the event memory which is compressed by the present invention.

An example of a hardware decompression circuit is shown in FIG. 11 which is for decompressing the timing data received from the event memory that is compressed by compression technique of the present invention. In this example, all compression and decompression process is performed by system software. The hardware decompressor 22 of FIG. 5 includes a clock count state machine 31, a load/down counter 32, a vernier control state machine 33, and a storage and selection circuit 36. This example of storage and selection circuit 36 includes registers 41–44 and multiplexers 45–47.

The clock count data from the clock count memory 20 is provided to the clock count state machine 31 and the load/down counter 32. As described with reference to FIGS. 5–10, in the preferred embodiment, the clock count data from the memory 20 is configured by either one, two, three or four data words, each word of which has a structure of 8 bits, i.e., a byte. The vernier data from the vernier data memory 21 is provided to the registers 41 and 42 in the storage and selection circuit 36. As in the foregoing, in the preferred embodiment, the vernier data is formed of 40 bits for describing up to four vernier events.

In receiving the clock count data, the clock count state machine 31 determines the number of data bytes of each event by sampling the most significant bits of clock count data. Based on the determination, the state machine 31 loads the data bytes from the clock count memory 20 to the right location of the load/down counter 32. As noted above, each data word is 8-bit and the assigned data bits in the data word are different between the first word and the second to fourth words. Thus, the state machine 31 must allocate the clock count data in the data words to right locations of the load/down counter 32. In the preferred embodiment, the load/down counter 32 is a 27-bit counter.

The state machine 31 enable and disable the load/down counter 32. Thus, the clock count data is loaded in the counter 32, thereby the counter 32 down-counts the reference clock until it reaches zero (terminal count). In other words, the terminal count is produced at the timing delayed by the time defined by the clock count data. The terminal count is sent to the clock count state machine 31. The clock count state machine 31 also determines the number of vernier events attached to the clock count data by monitoring the data in the first data word (#5 and #6 bits of FIG. 5). Based on this determination, the state machine 31 sends the appropriate vernier data to be used in the current event to the vernier control state machine 33.

The storage and selection circuit 36 receives the vernier data from the vernier data memory 21. In the foregoing examples such as shown in the tables of FIGS. 5–8, each memory location of the vernier data memory 21 consists of 40 bits for four (4) vernier data. In the storage and selection circuit 36, each of the registers 41 and 42 has a 40-bit width so that the storage and selection circuit 36 contains a total of eight (8) vernier data therein. The vernier data from the memory 21 is alternately set to one of the registers 41 and 42 at a time. This allows sufficient data to be consumed by the event process controller 23 even though the access speed of the vernier data memory 21 may be low.

Preferably, each of the registers 43 and 44 also has a 40-bit width to receive the vernier data from the corresponding registers 41 and 42. The registers 41 and 43 send the specified vernier data in parallel to the multiplexer 45 so that the multiplexer 45 can transmit the correct vernier data in a series fashion to the multiplexer 47. Similarly, the registers 42 and 44 send the specified vernier data in parallel to the multiplexer 46 so that the multiplexer 46 can transmit the correct vernier data in a series fashion to the multiplexer 47.

Such operations of selecting the vernier data in the registers 41–44 and the multiplexers 45–47 are made under the control of the vernier control state machine 33. Namely, the state machine 33 controls the loading operations of the registers 41 and 42, for example, the timing of receiving the vernier data and the selection as to which register should receive the vernier data. The state machine 33 also controls as to which vernier data should be provided to the multiplexers 45 and 46 in the parallel fashion and to sending the correct vernier data in the series fashion from the multiplexer 47 to the event process controller 23.

The state machine 33 also sends instructions to the event process controller 23 and the fine delay controller 24. For example, the state machine 33 sends instructions to the event process controller 23 as to which vernier data is the first vernier of the current event. The event process controller 23 sums the vernier data from the first vernier to the most recent vernier based on such instructions. If there arises a carry over (reaches one reference clock period), one reference clock period is added to the terminal count of the down counter 32 received via the state machine 33.

Based on this summing process, the event process controller 23 sends an event start signal (integral of the reference clock period) and vernier data (fractional data less carry over) to the fine delay controller 24. The fine delay controller 24 adds the fine delay time defined by the vernier data to the event start signal. The output events of the fine delay controller 24 are supplied to the DUT 28 through the pin electronics 26 as test signals.

According to the present invention, the event based semiconductor test system is capable of storing event data in the clock count memory and the vernier data memory in the compressed manner to substantially reduce the size of the memory and decompressing the event data for producing events of various timings to be used to evaluate a semiconductor device under test. In the event based test system, the timing data of each of the events is defined by a time length from the previous event. The hardware decompressor of the present invention makes it possible to reproduce the event timing data based on the compressed event timing data read out from the event memory for generating event based test signals to evaluate a semiconductor device under test.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event based test system for testing an electronics device under test (DUT), comprising:
   a clock count memory for storing clock count data of each event which is an integer multiple of a reference clock period (integral part data), said clock count data being formed of one or more data words depending on the value of the integral part data, and at least one data word including a flag to indicate whether the next word being needed, a number of vernier data attached to a current event, and at least a part of the integral part data;
   a vernier data memory for storing vernier data of each event which is a fraction of the reference clock period (fractional part data), said vernier data memory storing vernier data for two or more events in the same memory location;
   an address sequencer for generating address data for accessing said clock count memory and said vernier data memory to read out said clock count data and said vernier data therefrom; and
   a decompressor for reproducing the clock count data from the clock count memory and the vernier data from the vernier data memory corresponding to each event.

2. An event based test system as defined in claim 1, further comprising:
   an event process controller for producing an overall delay time of each event relative to a predetermined reference point based on the clock count data and vernier data from the decompressor; and
   a fine delay controller for generating each event based on said overall delay time to produce test signals for testing the DUT.

3. An event based test system as defined in claim 1, wherein a timing of each event is a time difference between two adjacent events and is defined by the clock count data and the vernier data.

4. An event based test system as defined in claim 1, wherein the decompressor is comprised of:
   a counter for loading the clock count data from the clock count memory and down counting the clock count data by the reference clock;
   a clock count state machine for interpreting the clock count data and controlling the operation of the counter in loading the clock count data and counting the reference clock;
   a storage and selection circuit for storing the vernier data from the vernier data memory for two or more events in a parallel manner and selecting the vernier data to send the vernier data in a series manner to the event process controller; and
   a vernier control state machine for controlling the operation of the storage and selection circuit based on instructions received from the clock count state machine.

5. An event based test system as defined in claim 4, wherein the storage and selection circuit includes a pair of registers for storing the vernier data from the vernier data memory in a parallel fashion, and a multiplexer for selecting the vernier data from one of the registers.

6. An event based test system as defined in claim 5, wherein the storage and selection circuit includes:
   a first and second registers for storing the vernier data from the vernier data memory in a parallel fashion;
   a third register for receiving the vernier data from the first register;
   a fourth register for receiving the vernier data from the second register;
   a first multiplexer for receiving a plurality of vernier data in a parallel form from the first and third registers and producing the vernier data in a series form based on the control of the vernier control state machine;
   a second multiplexer for receiving a plurality of vernier data in a parallel form from the second and fourth registers and producing the vernier data in a series form based on the control of the vernier control state machine; and
   a third multiplexer for selecting an output of the first multiplexer or the second multiplexer second based on the control of the vernier control state machine.

7. An event based test system as defined in claim 1, further comprising a pin electronics between said fine delay controller and said DUT.

8. An event based test system as defined in claim 1, wherein said data word is comprised of eight (8) bits and at least one bit of which is used as the flag, and the clock count data stored in the clock count memory is comprised of a varying number of data words ranging from one word to four words in which the first data word includes data indicating the number of vernier data attached to the current event.

* * * * *